United States Patent [19]

Jacob et al.

[11] 4,043,861

[45] Aug. 23, 1977

[54] PROCESS FOR POLISHING SEMICONDUCTOR SURFACES AND POLISHING AGENT USED IN SAID PROCESS

[75] Inventors: Herbert Jacob; Ingolf Lampert, both of Burghausen, Germany

[73] Assignee: Wacker-Chemitronic Gesellshaft fur Elektronik Grundstoffe mbh, Burghausen, Germany

[21] Appl. No.: 749,194

[22] Filed: Dec. 9, 1976

[30] Foreign Application Priority Data

Jan. 13, 1976 Germany .............................. 2600990

[51] Int. Cl.² ............................................. C09K 13/00
[52] U.S. Cl. .................................... 156/636; 156/662; 252/79.1; 252/313 R
[58] Field of Search ................. 252/79.5, 79.1, 313 R; 156/635, 636, 638, 662; 51/309 R, 307

[56] References Cited

U.S. PATENT DOCUMENTS

| | | | |
|---|---|---|---|
| 3,342,652 | 9/1967 | Reisman et al. | 156/636 |
| 3,738,882 | 6/1973 | Basi | 156/636 |
| 3,775,201 | 11/1973 | Basi | 156/636 |
| 3,869,324 | 3/1975 | Basi et al. | 156/636 |

*Primary Examiner*—William A. Powell
*Assistant Examiner*—Jerome W. Massie
*Attorney, Agent, or Firm*—Allison C. Collard

[57] ABSTRACT

Process for polishing semiconductor surfaces, especially gallium phosphide surfaces, with an aqueous suspension of aluminum and/or gallium hydroxide precipitated from the elements by an alkaline compound at the pH value between 7.5 and 8, the suspension further containing an alkali hypochlorite in such an amount that in addition to 0.05–0.6 mol hydroxide per liter, the molar content of hypochlorite will be three to ten times that of the hydroxide; the surfaces are subjected to a buffing action with said suspension. The invention also relates to the polishing agent used in the process.

8 Claims, No Drawings

PROCESS FOR POLISHING SEMICONDUCTOR SURFACES AND POLISHING AGENT USED IN SAID PROCESS

The invention relates to a process for polishing semiconductor surfaces, especially gallium phosphide surfaces, and to a polishing agent used in the process.

In the field of epitaxy high demands are made as regards the surface quality of semiconductor substrates. The aim to provide surfaces free of defects, therefore, led to the development of many polishing processes, which, however, did not prove satisfactory.

It is known, for example, from Dt-OS 2,252,045 to polish gallium phosphide surfaces with solutions containing alkali metal or alkali earth metal hypobromites. However, these hypobromite solutions are exceedingly instable, so that it is often impossible to obtain results which can be repeated. Moreover, these compounds are too expensive for technical purposes.

Another process is known from U.S. Pat. No. 3,342,652 in which gallium arsenide surfaces are polished with aqueous solutions containing sodium hypochlorite and alkali carbonates. However, the abrasion rates in this process are only satisfactory, when the solutions contain a large amount of sodium hypochlorite, but lead in that case to oxidized and corroded surfaces.

Another known process for polishing semiconductor materials uses sodium hypochlorite, sodium silicate and sodium zirconate. Although the solid particles of the suspension lead to satisfactory abrasion rates, the surface quality of the materials is poor. (Dt-OS 2,454,802)

It is the object of the present invention to provide a process and an agent for polishing the surfaces of semiconductor materials which avoid the shortcomings of the known processes.

It is another object of the invention to provide a polishing process for semiconductor surfaces, particularly gallium phosphide surfaces, which will comply with the high standards both in abrasion rates and surface quality required by modern industrial production.

The objects are accomplished by using as a polishing agent a suspension obtained by precipitating by means of alkaline compounds the hydroxides of gallium and/or aluminum from an aqueous solution containing the salts of the mentioned elements with the adjustment of the pH value to 7.5 –8, the suspension containing in addition to 0.05 –0.6 mol hydroxide, 3 to 10 times the molar amount of alkali hypochlorite per liter.

The polishing agent according to the invention is preferably prepared by adding to an aqueous solution of gallium salts, or preferably aluminum salts, such an amount of an alkaline compound that at a pH value of 7.5 to 8, aluminum hydroxide and/or gallium hydroxide will be precipitated. As gallium salts we use e.g. the chloride or the sulfate, as aluminum salts the chloride, sulfate or acetate, singly or in mixture; as alkaline compounds, e.g. the phosphates of potassium or sodium, the carbonates of calcium or sodium, the hydroxide of potassium, or preferably sodium. Subsequently, the suspension is admixed with alkali hypochlorite, e.g. lithium hypochlorite in such an amount that the polishing suspension will contain in addition to 0.05 –0.6 mol, preferably 0.1 –0.3 mol, gallium and/or aluminum hydroxide, 3 to 10 times, preferably 5 to 8 times the molar amount of hypochlorite per liter.

When concentrated salt solutions are initially used, the characteristic molar amounts are obtained by dissolving with water.

The hypochlorite-containing aqueous solution to be used is e.g. preferably the commercial bleach which is obtained by reaction of chlorine with sodium hydroxide solution. Similarly, "Eau de Javelle" may be used, which is potassium hypochlorite solution obtained by reaction of chlorine with potassium hydroxide solution. In the conventional procedure, the polishing suspension is constantly moved, e.g. stirred, in a stock container, in order to avoid settling of aluminum and/or gallium hydroxide at the bottom; it is delivered to the polishing device, more particularly the polishing plate, from the container by means of a suitable pump, e.g. with tubing attachment, at a rate of about 2 to 10 ml/min. when the entire surface of the semiconductor to be polished is 100 $cm^2$.

The process according to the invention is not limited to the polishing of gallium phosphide surfaces, for which it is primarily used, but it has general application to the polishing of semiconductor materials, especially III-V semiconductors, such as gallium arsenide.

The advantages of the polishing agent are the inexpensive and easily available starting materials, and the comparatively low corrosiveness as regards iron, which permits the use of conventional polishing machines. The gallium arsenide and phosphide discs polished by the process of the invention exhibit very even scratch and haze-free surfaces.

The invention will be more fully described in two examples, but it should be understood that these are given by way of illustration and not of limitation.

EXAMPLE 1

Nine monocrystalline gallium phosphide discs, each having a diameter of 35 mm and a thickness of 420 $\mu$m, were glued with a suitable wax mixture to supporting plates of stainless steel having a diameter of 22 cm. Three such supporting plates were placed onto the polishing wheel of a polishing machine having a diameter of 52 cm; the wheels were covered with a hard polishing cloth. For making the polishing suspension, 48.2 g $AlCl_3 \cdot 6 H_2O$ were dissolved in 200 ml water and adjusted to a pH value of 7.5 by means of about 300 ml 2N NaOH. Subsequently, 0.5 l of a commericial bleach containing 180 g NaOCl per liter were added, and water was added to yield 200 l, corresponding to a content of aluminum hydroxide of 0.1 mol/liter and of sodium hypochlorite of 0.6 mol per liter in the polishing suspension. Polishing was then performed with this polishing agent, the wheel having a rate of 90 rpm and a contact pressure of 0.2 $kp/cm^2$, and the temperature of the supporting plates being about 45° C. The abrasion rate was 150 $\mu$m/h with a discharge velocity of the polishing suspension onto the polishing wheel of 10 ml/min.

The total removal was about 40 $\mu$m. The polished gallium phosphide discs showed a faultlessly polished, scratch and wave-free surface.

EXAMPLE 2

In analogy to Example 1, gallium arsenide discs were polished with a suspension made by dissolving 142.3 g $KAl(SO_4)_2 \cdot 12 H_2O$ in 300 ml water, adjusted to a pH value of 7.5 with 450 ml 2N NaOH, to which were added 1 liter commercial bleach containing 180 g NaOCl/liter and water in an amount to yield 2 liters of suspension containing 0.15 mol/liter of aluminum hydroxide and 1.2 mol/liter sodium hypochlorite. The abrasion rate was 180 μm per hour at a discharge velocity of the polishing suspension onto the polishing wheel of 10 ml/min. The total removal was about 45 μm. The polished gallium arsenide discs showed upon testing with a focussed light ray haze-free polished surfaces.

From the foregoing description, one skilled in the art can easily ascertain the essential characteristics of this invention, and without departing from the spirit and scope thereof, can make various changes and modifications of the invention to adapt it to various usages and conditions. Consequently, such changes and modifications are properly, equitably and intended to be, within the full range of equivalence of the following claims.

WHAT IS CLAIMED IS:

1. A process for polishing semiconductor surfaces which comprises preparing an aqueous suspension of a hydroxide of a member of the group consisting of aluminum, gallium, and a mixture of the two, by precipitating the hydroxide from an aqueous solution containing a salt of said elements with an alkaline compound at a pH value between 7.5 and 8, thus forming the suspension, adding to said suspension an alkali hypochlorite in such an amount that in addition to 0.05 –0.6 mol hydroxide per liter the molar content of the hypochlorite per liter will be three to ten times that of the hydroxide, and subjecting the surfaces to a buffing action with said suspension.

2. The process according to claim 1, wherein the surfaces to be polished are gallium phosphide articles.

3. The process acording to claim 1, wherein the hydroxide content of the suspension is adjusted to 0.1 –0.3 mol per liter.

4. The process according to claim 1, wherein per mol of hydroxide, 5 –8 mols of alkali hypochlorite are added to the suspension.

5. The process according to claim 1, wherein the hydroxide in the suspension is aluminum hydroxide.

6. The process according to claim 1, wherein the hypochlorite added to the suspension is sodium hypochlorite.

7. A polishing agent for polishing semiconductor surfaces consisting of an aqueous suspension of a hydroxide of a member of the group consisting of aluminum, gallium, and a mixture of aluminum and gallium, in an amount of 0.05 –0.6 mol per liter, and an alkali hypochlorite in the amount of per liter 3 –10 times the molar amount of the hydroxide.

8. The polishing agent according to claim 7, wherein the aqueous suspension contains per liter 0.1 –0.3 mol aluminum hydroxide and sodium hypochlorite in the amount of 5 –8 times the molar amount of the aluminum hydroxide.

* * * * *